(12) United States Patent
Cheng et al.

(10) Patent No.: US 12,760,408 B2
(45) Date of Patent: Oct. 13, 2026

(54) PARTICLE PREVENTION METHOD IN CHAMBER

(71) Applicant: SKY TECH INC., Hsinchu County (TW)

(72) Inventors: Yao-Syuan Cheng, Hsinchu County (TW); Ta-Hao Kuo, Hsinchu County (TW); Chi-Hung Cheng, Hsinchu County (TW); Kuo-Ju Liu, Hsinchu County (TW); Ching-Liang Yi, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 536 days.

(21) Appl. No.: 18/231,900

(22) Filed: Aug. 9, 2023

(65) Prior Publication Data

US 2025/0051907 A1 Feb. 13, 2025

(51) Int. Cl.

| | |
|---|---|
| ***C23C 14/56*** | (2006.01) |
| ***C23C 16/44*** | (2006.01) |
| ***H01J 37/32*** | (2006.01) |

(52) U.S. Cl.
CPC ........ *C23C 14/564* (2013.01); *C23C 16/4408* (2013.01); *H01J 37/32449* (2013.01); *H01J 37/32633* (2013.01); *H01J 37/32651* (2013.01)

(58) Field of Classification Search
CPC ... C23C 14/34; C23C 14/564; C23C 16/4408; H01J 37/32449; H01J 37/32834; H01J 37/3441; H01J 37/32651; H01J 37/32633
See application file for complete search history.

(56) References Cited

U.S. PATENT DOCUMENTS

| | | | | |
|---|---|---|---|---|
| 6,171,453 B1 * | 1/2001 | Chung | ................ | H10P 72/7606 204/192.15 |
| 2001/0014540 A1 * | 8/2001 | Shan | ................ | H01J 37/32477 438/710 |
| 2004/0063333 A1 * | 4/2004 | Saigusa | ............ | H01J 37/32431 438/758 |
| 2006/0151114 A1 * | 7/2006 | Fink | ................ | H01J 37/32633 118/715 |
| 2008/0110860 A1 * | 5/2008 | Miller | .............. | H01J 37/32623 216/67 |
| 2016/0172217 A1 * | 6/2016 | Miyata | ............... | H10P 72/0402 156/345.29 |

* cited by examiner

*Primary Examiner* — Scott W Dodds
(74) *Attorney, Agent, or Firm* — HDLS IPR SERVICES; Chun-Ming Shih

(57) ABSTRACT

A particle prevention method in chamber includes providing a shielding ring, wherein the shielding ring includes a first side wall, a second side wall, and a bottom, the second side wall is parallel to the first side wall, and the bottom is connected to the first side wall, and the second side wall to form an annular groove area; connecting the first side wall to the reaction chamber with the first side wall extending toward an upper portion of a accommodating space of a reaction chamber; fixing a first deflector plate to the first side wall, wherein the first deflector plate extends obliquely toward the bottom, and the first deflector plate is located above the aperture; and fixing a second deflector plate to the second side wall, wherein the second deflector plate is located above the first deflector plate, and the second deflector plate extends obliquely toward the bottom.

13 Claims, 7 Drawing Sheets

PARTICLE PREVENTION METHOD IN CHAMBER

BACKGROUND

Technical Field

This disclosure relates to coating equipment and coating methods, in particular to a particle prevention method in chamber and a particle prevention device in chamber.

Related Art

As shown in FIG. 1, in a coating apparatus 1 for sputtering thin films, particles constituting a thin film are provided by a target 2, and the target 2 undergoes a high-energy gas ion impingement or other means to generate a molecular beam for sputtering a wafer located below. However, atoms of the target 2, such as carbon atoms used to form a carbon thin film, can adhere well to the wafer and grow into a carbon thin film, but the target particles formed by the carbon atoms contacting the cover ring 3, the shielding ring 4, and the shielding wall 5 do not adhere well, and target particles floating in the air occurs. Or, after carbon atoms are deposited as carbon layers on the aforesaid cover ring 3, shielding ring 4, and shielding wall 5, the carbon layers finally fall off due to poor adhesion, which makes it necessary to take time to clean up the carbon layer that falls off inside the reaction chamber 6 when the coating equipment 1 is subsequently maintained. Target particles floating in the air may also settle on the surface of the wafer, affecting the growth of the film on the wafer and the quality of the film.

In the art, to minimize the deposition of target particles, the lower part of the reaction chamber 6 is equipped with an exhaust port 7, which is connected to a vacuum pump 8 for continuous pumping. And the working gas, such as inert gas, is continuously introduced into the reaction zone 6*a* in the upper part of the reaction chamber 6, and then passes through the shielding ring 4 surrounding the holder plate 9 to the lower part of the reaction chamber 110, and is finally withdrawn by the exhaust port 7. The working gas is continuously pumped out by the vacuum pump 8 to drive the floating carbon particles out of the reaction chamber 6 by air flow.

However, the air flow path formed between the cover ring 3 and the shielding ring 4 is tortuous, which is prone to form a backflow phenomenon in the reaction chamber 6, causing floating target particles to backflow to the wafer, and ultimately adhering to the thin film and affecting the quality of the thin film, or contaminating the reaction chamber 6 and increasing the time needed to clean the reaction chamber 6.

SUMMARY

In view of the above problem, this disclosure provides a particle prevention method in chamber and a particle prevention device in chamber to remove floating target particles and prevent target particles from contaminating the chamber and the coating.

This disclosure provides a particle prevention method in chamber configured to remove particle in a reaction chamber, wherein a holder plate is disposed within an accommodating space of the reaction chamber; the method comprising: providing a shielding ring, wherein the shielding ring includes a first side wall, a second side wall, and a bottom, the second side wall is parallel to the first side wall, the bottom being is connected to the first side wall, and the second side wall to form an annular groove area, and the bottom is provided with at least one flow aperture, and an inner side of the second side wall defines an opening to receive the holder plate; connecting the first side wall to the reaction chamber with the first side wall extending toward an upper portion of a accommodating space of the reaction chamber; connecting the first side wall to the reaction chamber with the first side wall extending toward an upper portion of a accommodating space of the reaction chamber; fixing a first deflector plate to the first side wall, wherein the first deflector plate extends obliquely toward the bottom, such that the first deflector plate is located above the at least one flow aperture of the bottom; and fixing a second deflector plate to the second side wall, wherein the second deflector plate is located above the first deflector plate, and the second deflector plate extends obliquely toward the bottom.

Without contacting the bottom and the first side wall.

In one or more embodiments, the first side wall and the second side wall are circular walls.

In one or more embodiments, the particle prevention method in chamber further comprising disposing a cover ring above the shielding ring.

In one or more embodiments, the cover ring comprises a horizontal extension portion and a vertical extension portion. the horizontal extension portion is horizontal extension portion, and the horizontal extension portion is disposed at a top edge of the second side wall. the vertical extension portion perpendicularly extends from the horizontal extension portion and located between the first side wall and the second side wall.

In one or more embodiments, the vertical extension portion extends toward the bottom without contacting the bottom.

In one or more embodiments, the method further comprises providing the horizontal extension portion to partially shield the annular groove area from above.

In one or more embodiments, the method further comprises providing a first connection portion and a second connection portion; wherein the first connection portion is fixed to the first side wall, and the first deflector plate extends from the first connection portion to be indirectly fixed to the first side wall; the second connection portion is fixed to the second side wall, and the second deflector plate extends from the second connection portion to be indirectly fixed to the second side wall.

the method further comprises partially shielding the at least one flow aperture in a radial direction with the first deflector plate.

In one or more embodiments, the method further comprises partially shielding the first deflector plate from above with the second deflector plate.

This disclosure further provides a particle prevention device in chamber comprising a shielding ring, a first deflector plate, and a second deflector plate. the shielding ring includes a first side wall, a second side wall, and a bottom. The first side wall extends toward an upper portion of the accommodating space and connected to the reaction chamber. The second side wall is parallel to the first side wall, extends toward the upper portion of the accommodating space, and an inner side of the second side wall defines an opening to receive the holder plate, and the bottom being is connected to the first side wall, and the second side wall to form an annular groove area, and the bottom is provided with at least one flow aperture. the first deflector plate is connected to the first side wall and extends obliquely toward the bottom. The first deflector plate is located above the at least one flow aperture of the bottom. the second deflector plate is connected to the second side wall and located above the first deflector plate, and extends obliquely toward the bottom.

In one or more embodiments, the first side wall and the second side wall are circular walls.

In one or more embodiments, the particle prevention device in chamber further comprises a cover ring disposed above the shielding ring.

In one or more embodiments, the cover ring comprises a horizontal extension portion and a vertical extension portion. the horizontal extension portion is horizontal extension portion, and the horizontal extension portion is disposed at a top edge of the second side wall. the vertical extension portion perpendicularly extends from the horizontal extension portion and located between the first side wall and the second side wall.

In one or more embodiments, the vertical extension portion extends toward the bottom without contacting the bottom.

In one or more embodiments, the horizontal extension portion partially shields the annular groove area from above.

In one or more embodiments, the particle prevention device in chamber further comprises a first connection portion and a second connection portion; wherein the first connection portion is fixed to the first side wall, and the first deflector plate extends from the first connection portion to be indirectly fixed to the first side wall; the second connection portion is fixed to the second side wall, and the second deflector plate extends from the second connection portion to be indirectly fixed to the second side wall.

In one or more embodiments, the first deflector plate partially shields the at least one flow aperture in a radial direction.

In one or more embodiments, the second deflector plate partially shields the first deflector plate from above.

Through the above approaches, this disclosure is able to sufficiently remove the target material particles floating in the reaction chamber, avoid the target material particles floating or affect the quality of the film growth, and at the same time, reduce the deposition of the target material in the equipment, prolong the maintenance cycle of the equipment, and shorten the time needed for the maintenance of the equipment.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
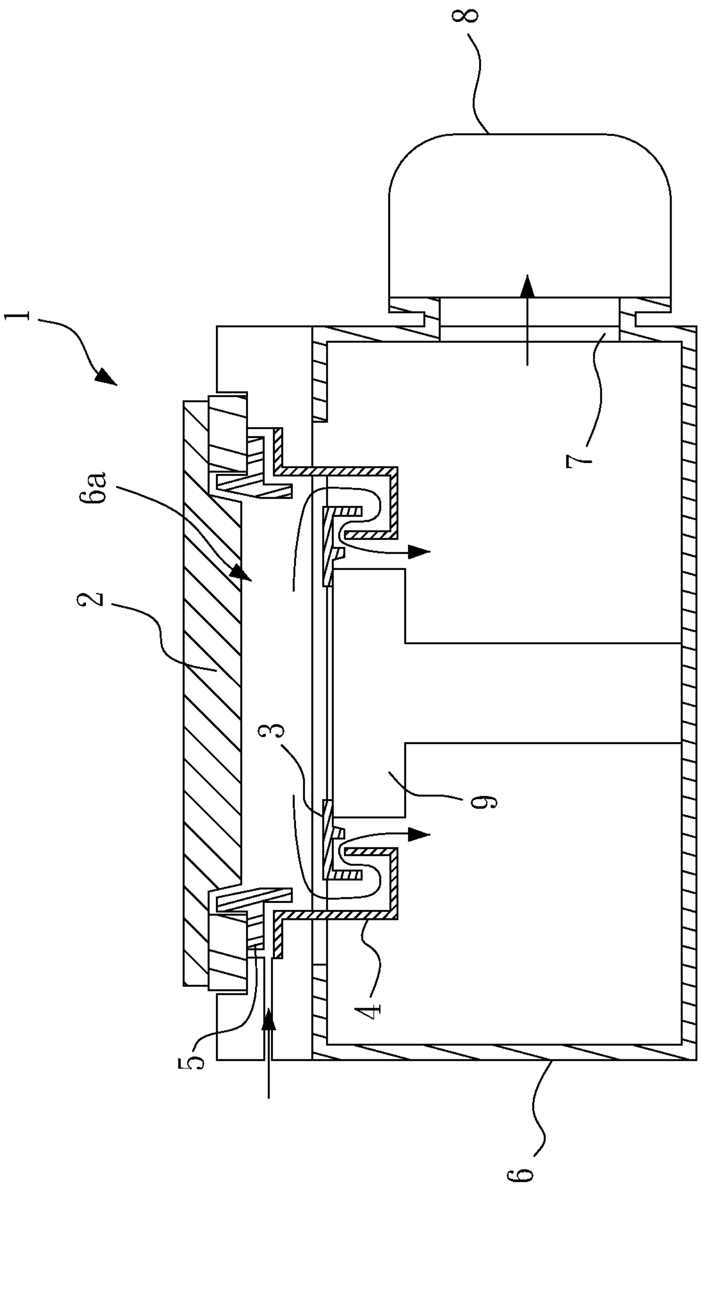
Fig. 1 (Prior Art)
FIG. 1 is a cross-sectional view of a coating equipment in the art.
Figure 2:
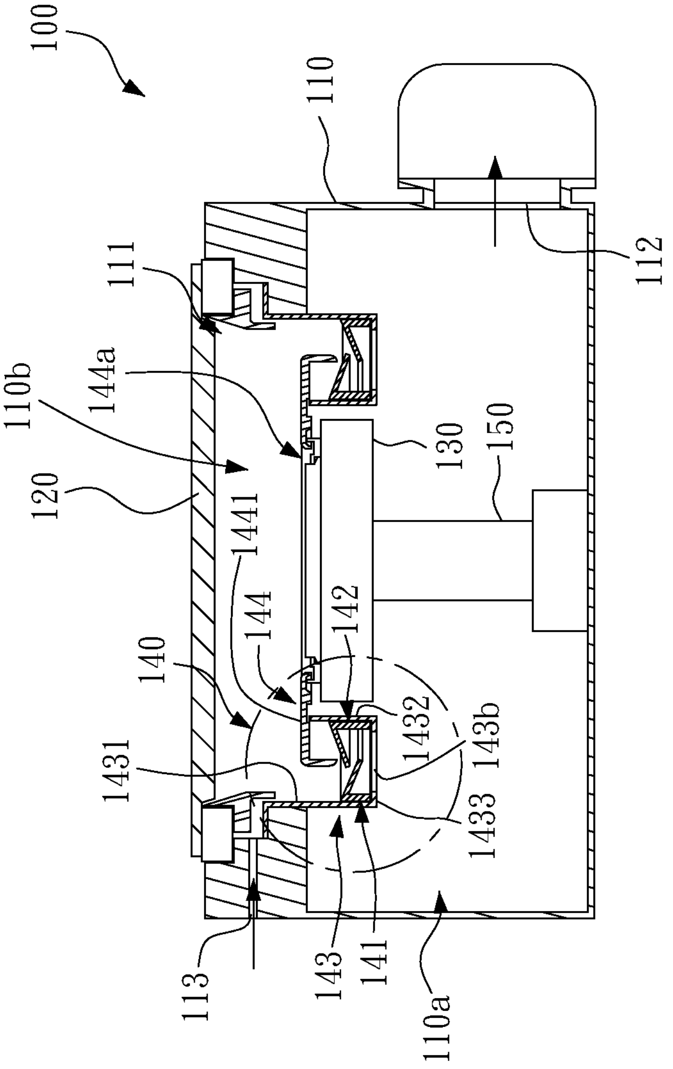
FIG. 2 is a cross-sectional view of a coating equipment according to an embodiment of this disclosure.

Please refer to FIG. 1 and FIG. 2, a particle prevention device 140 in chamber and a coating equipment 100 having the particle prevention device 140 are shown, which are configured to perform a particle prevention method in chamber.

As shown in FIG. 2, the coating equipment 100 includes a reaction chamber 110, a target 120, a holder plate 130, and the particle prevention device 140.

As shown in FIG. 2, the reaction chamber 110 is provided with an accommodating space for accommodating the holder plate 130 and the holder plate 120. the holder plate 130 is configured to hold a wafer, and the target 120 is disposed at an upper portion of the accommodating space 110*a* and faces the holder plate 130 and a wafer on the holder plate 130. the reaction chamber 110 is provides with a setting opening 111. The setting opening 111 is connected to the exterior of the reaction chamber 110, and the target 120 is fixed in the setting opening 111 such that the target 120 and the reaction chamber 110 form the closed accommodating space 110*a*.

As shown in FIG. 2, The holder plate 130 is connected to a linear actuator 150. The linear actuator 150 is configured to drive the holder plate 130 to move relative to the target 120, so as to change the distance between the holder plate 130 and the target 120. The linear actuator 150 may be, but not limited to, a hydraulic actuator, a pneumatic actuator, a linear screw actuator, and the like. The wafer is moved onto the carrier tray 130 by a robotic arm or pickup device. Driven by the linear actuator 150, the holder plate 130 moves the wafer toward the target 120 to reduce the distance between the wafer carried by the holder plate 130 and the target 120, so at to perform thin film deposition of the wafer.

As shown in FIG. 1, The coating equipment 100 of this disclosure may be a sputter deposition equipment that applies an electric field to the accommodating space 110*a* to cause inert gas atoms in the accommodating space 110*a* became Ionized gas molecules to impact target 120. A bias voltage is applied between the target 120 and the holder plate 130 to cause ionized gas molecules to impact the target 120, so as to generate sputtering atoms formed from the target 120. The target atoms generated by the impingement are attracted by the bias on the molecular beam 130 to form a molecular beam and deposit on the surface of the wafer to form a thin film on the surface of the wafer. However, atoms that do not land on the wafer, such as atoms that land on the inner wall of the reaction chamber 110, will not be able to well attach and will either form floating target particles or form an unstable film that will easily fall off. Therefore, the floating target particles have to be quickly collected and discharged out of the accommodating space 110*a*. An Ideal approach is to discharge the floating target particles along with the inert gas that is introduced into the accommodating space 110*a* to prevent target particles from falling on the surface of the wager to affect the quality of the film or undeposited and formed contaminants in the coating apparatus 100, which shortens the cycle wherein the coating apparatus 100 has to be cleaned and lengthens the time required to clean the coating apparatus 100.

Figure 3:
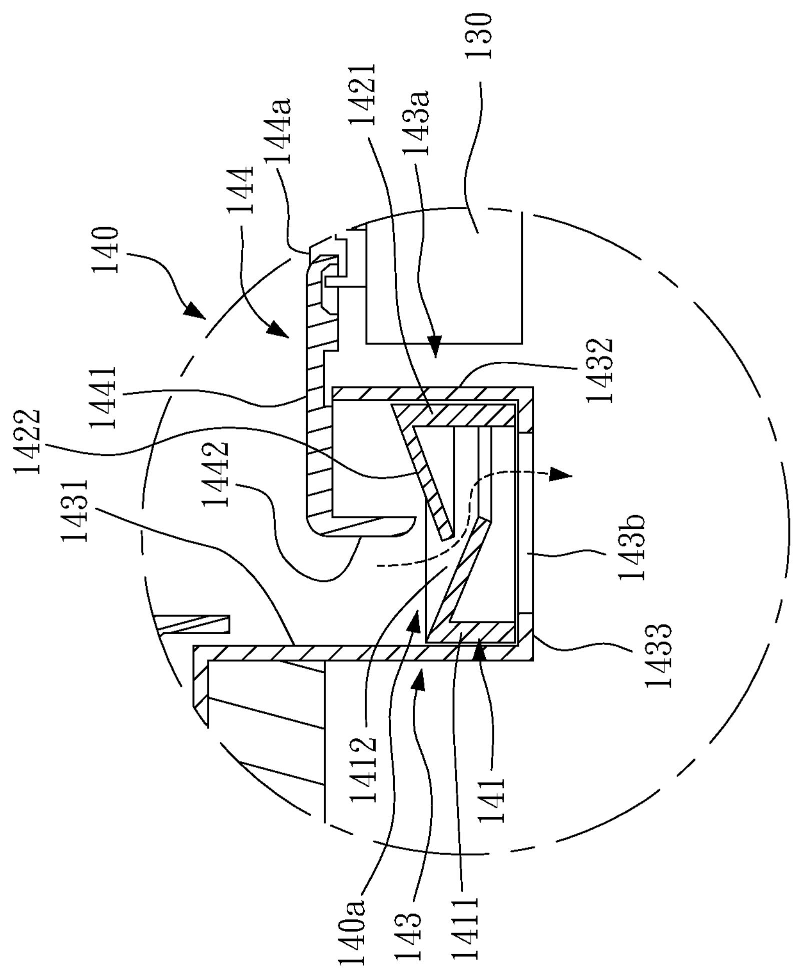
FIG. 3 illustrates an enlarged view of a portion in FIG. 2.

As shown in FIG. 2 and FIG. 3, the particle prevention device 140 comprises a shielding ring 143, a cover ring 144, and a flow conductor 140*a*.

Figure 4:
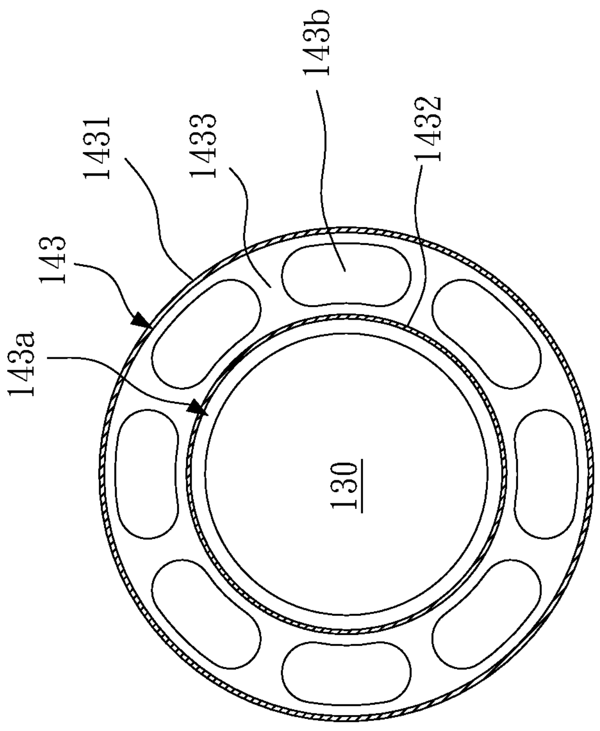
FIG. 4 is a top view of a shielding ring in the embodiment of this disclosure.

As shown in FIG. 2, FIG. 3 and FIG. 4, the shielding ring 143 is a ring-shaped structure including a first side wall 1431, a second side wall 1432, and a bottom 1433. The material of the shielding ring 143 may be a metal or ceramic material, but the use of other materials is not excluded. The first side wall is a circular wall and extends toward an upper portion of the accommodating space 110*a* and connected to the reaction chamber 110. The second side wall 1432 is also a circular wall in parallel to the first lateral wall 601 and extends toward the upper portion of the accommodating space 110*a*. An inner side of the second side wall 1432 defines an opening 143*a*. The holder plate 130 is configured to move toward the target 120 to contact the shielding ring 143 or enter the opening 143*a* of the shielding ring 143, so that the reaction chamber 110, the holder plate 130, the target 120, and the shielding ring 143 will define a reaction space 110*b* within the accommodating space 110*a*, and the thin film deposition of the wafer on the holder plate 130 will be performed in the reaction space 110*b*.

As shown in FIG. 2, FIG. 3 and FIG. 4, the bottom 1433 is connected to the first side wall 1431, and the second side wall 1432, such that an annular groove area is defined among the first side wall 1431, the bottom 1433 and the second side wall 1432. The bottom 1433 is provided with one or more curved, circular, elliptical, or square flow apertures 143*b* to connect two sides of the bottom 1433.

As shown in FIG. 2 and FIG. 3, the cover ring 144 is disposed above the shielding ring 143, and the cover ring 144 includes a horizontal extension portion 1441 and a vertical extension portion 1442. the horizontal extension portion 1441 is horizontal extension portion 144*a*, and the horizontal extension portion 1441 is disposed at a top edge of the second side wall 1432, such that the cover ring 144 is disposed above the shielding ring 143. The horizontal extension portion 1441 and the second side wall 1432 are disposed perpendicular to each other. When the holder plate 130 contacts the shielding ring 143 or enters the opening 143*a* of the shielding ring 143, the holder plate 130 is also positioned in the window 144*a*. Meanwhile, the horizontal extension portion 1441 is also provided extending toward the opening 143*a*, so that the gap between the horizontal extension portion 1441 and the edge of the holder plate 130 is as shortened as possible to shield the side wall of the holder plate 130.

As shown in FIG. 2 and FIG. 3, the vertical extension portion 1442 perpendicularly extends from the edge of the horizontal extension portion 1441, and the vertical extension portion 1442 is located between the first side wall 1431 and the second side wall 1432. The vertical extension portion 1442 extends toward the bottom 1433 without contacting the bottom 1433.

As shown in FIG. 2 and FIG. 3, The horizontal extension portion 1441 shields the second side wall and partial of the annular groove area from above. Further, as viewed in cross-section, the annular groove area is divided into an inner portion and an outer portion by the vertical extension portion 1442.

As shown in FIG. 2, FIG. 3, FIG. 5, and FIG. 6, the flow conductor 140*a* includes a first flow conducting member 141 and a second flow conducting member 142. The flow conductor 140*a* may be made of metal, a ceramic material, or a polymer material, but other materials are not excluded. The first flow conducting member 141 as well as the second flow conducting member 142 may be separate elements or may be formed into a single part.

Figure 5:
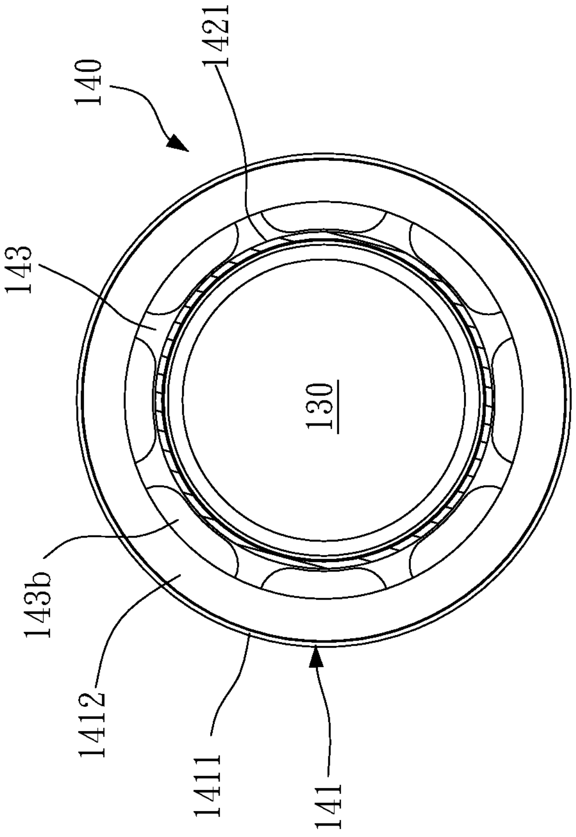
FIG. 5 is a top view of a first deflector plate and the shielding ring in the embodiment of this disclosure.
Figure 6:
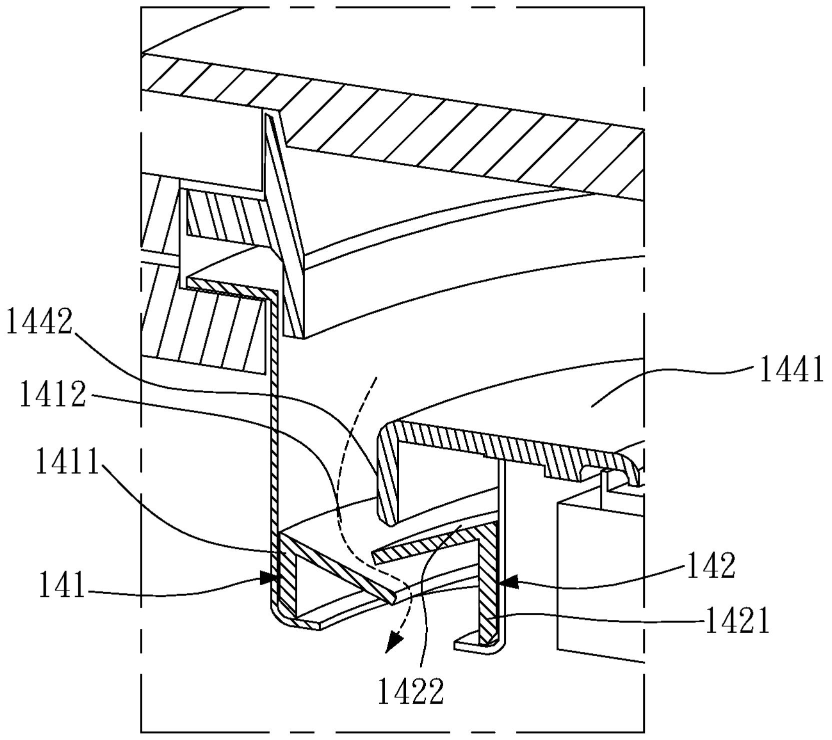
FIG. 6 illustrates a perspective partial sectional view of the particle prevention device in chamber of the embodiment.

As shown in FIG. 3, FIG. 5, and FIG. 6, the first flow conducting member 141 may be a ring-shaped structure and includes a first connection portion 1411 and a first deflector plate 1412. The first connection portion 1411 is fixed to the first side wall 1431. The first deflector plate 1412 is a ring-shaped structure and extends from the first connection portion 1411, such that the first deflector plate 1412 is indirectly fixed to the first side wall 1431 through the first connection portion 1411. In different embodiments, the first deflector plate 1412 is directly fixed to the first side wall 1431. The first deflector 1412 is a circular structure and extends obliquely toward the bottom 1433 without contacting the bottom 1433 and the second side wall 1432. In particular, a front edge of the first deflector plate 1412 extends below the horizontal extension portion 1441 and is partially located in the inner portion of the annular groove area.

As shown in FIG. 3, FIG. 5, and FIG. 6, The first deflector plate 1412 is located above the flow aperture 143*b* and partially shields the flow aperture 143*b* in the radial direction, so that the air flow can be guided on the upper surface of the first deflector plate 1412 and then pass through the flow aperture 143*b*, and the floating target particles can be blown to the below of the shielding ring 143, and be discharged out of the reaction chamber 110 through an exhaust port 112.

As shown in FIG. 3, FIG. 5, and FIG. 6, the second deflector 142 is a ring-shaped structure and includes a second connection portion 1421 and a second deflector plate 1422. The second connection portion 1421 is fixed to the second side wall 1432. The second deflector plate 1422 is a ring-shaped structure and extends from the first connection portion 1411, such that the second deflector plate 1422 is indirectly fixed to the second side wall 1432 through the second connection portion 1421. In different embodiments, the second deflector plate 1422 is directly fixed to the second side wall 1432. The second deflector plate 1422 is a ring-shaped structure and located above the first deflector plate 1412 and extends obliquely toward the bottom 1433 without contacting the bottom 1433 and the first side wall 1431. In particular, a front edge of the second deflector plate 1422 is located above the vertical extension portion 1442 and partially shields the first deflector plate 1412 from above. The second deflector plate 1422, the vertical extension portion 1442, and the second side wall 1432 define a half-enclosed area between the second deflector plate 1422 and the second side wall 1432, and by tilting the second deflector plate 1422 downward, the airflow toward the flow aperture 143*b* can be prevented from backflowing into this half-enclosed area, so as to make the flow of the airflow smoother.

As shown in FIG. 2, FIG. 3, and FIG. 6, after the inert gas or other working gas applied to sputtering is introduced into the reaction space 110*b* of the reaction chamber 110 from an inlet 113 of the reaction chamber 110, the air may flow toward the annular groove area of the shielding ring 143, and then be discharged from the exhaust port 112 after it is guided by the first deflector plate 1412 through the flow apertures 143*b*. Continuous injection as well as exhaust gas flow collects floating target particles in the reaction chamber 110. Due to the smoother flow of airflow, the inclined configuration of the first deflector plate 1412 and the second deflector plate 1422 also avoids the occurrence of airflow backflow phenomenon, thus reducing the floating target particles polluting the surface of the wafer, which affects the quality of the film growth.

Figure 7:
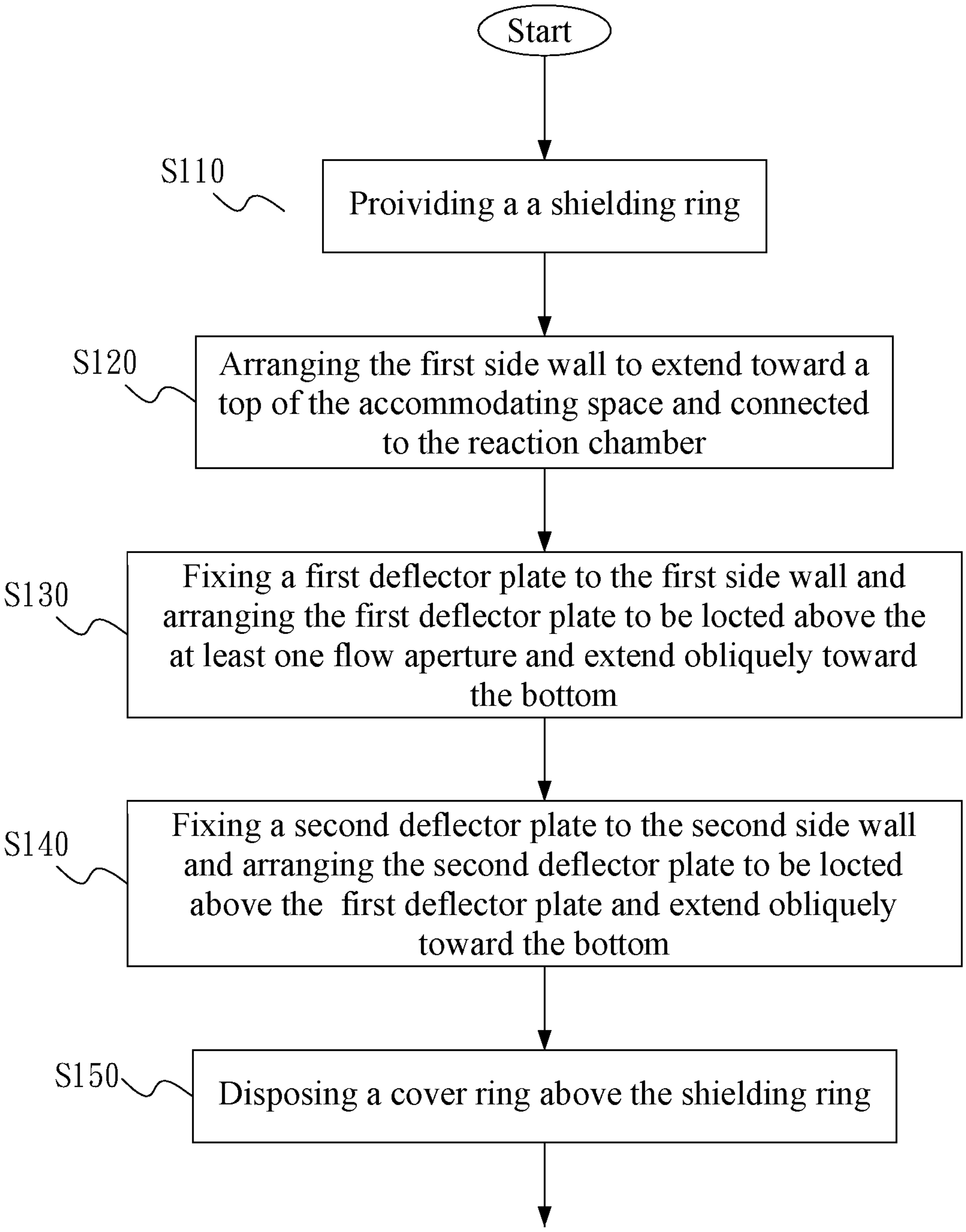
FIG. 7 is a flowchart of particle prevention method in chamber according to the embodiment of this disclosure.

FIG. 7 shows a particle prevention method in chamber configured to remove particle in a reaction chamber 110.

As shown in FIG. 2, FIG. 3 and FIG. 7, according to the method, a shielding ring 143 is provided first, as shown in step S110. As shown in FIG. 2 and FIG. 3, the shielding ring 143 includes a first side wall 1431, a second side wall 1432, and a bottom 1433. The second side wall 1432 is parallel to the first side wall 1431, and the first side wall 1431 and the second side wall 1432 are circular walls. the bottom 1433 is connected to the first side wall 1431, and the second side wall 1432, to form an annular groove area, The bottom 1433 is provided with at least one flow aperture 143*b*, and an inner side of the second side wall 1432 defines an opening 143*a* for receiving the holder plate 130.

As shown in FIG. 2, FIG. 3, and FIG. 7, then, arranging the first side wall 1431 to extend toward a top of the accommodating space 110*a* and connected to the reaction chamber 110, so as to fixing the shielding ring 143 in the reaction chamber 110, as shown in step S120.

As shown in FIG. 2, FIG. 3, and FIG. 7, a first deflector plate 1412 is fixed to the first side wall 1431, wherein the first deflector plate 1412 extends obliquely toward the bottom 1433 and the first deflector plate 1412 is located above the at least one flow aperture 143*b*, as shown in step S130. As shown in FIG. 2 and FIG. 3, the first deflector plate 1412 partially shields the at least one flow aperture 143*b*. As shown in FIG. 2 and FIG. 3, the first deflector plate 1412 is fixed by providing a first connection portion 1411, fixing the first connection portion 1411 to the first side wall 1431 with the first deflector plate 1412 extending from the first connection portion 1411 and indirectly fixing the first deflector plate 1412 to the first side wall 1431.

As shown in FIG. 2, FIG. 3, and FIG. 7, a second deflector plate 1422 is fixed to the second side wall 1432, the second deflector plate 1422 is located above the first deflector plate 1412, and the second deflector plate 1422 extends obliquely toward the bottom 1433 without contacting the bottom 1433 and the first deflector plate 1431, as shown in step S140. As shown in FIG. 2 and FIG. 3, The second deflector plate 1422 may further extend to partially shield the first deflector plate 1412 from above. As shown in FIG. 2 and FIG. 3, the second deflector plate 1422 is fixed by providing a second connection portion 1421, fixing the second connection portion 1421 to the second side wall 1432 with the second deflector plate 1422 extending from the second connection portion 1421 and indirectly fixing the second deflector plate 1422 to the second side wall 1432.

As shown in FIG. 2, FIG. 3, and FIG. 7, after step S140, the method further comprises a step of disposing a cover ring 144 above the shielding ring 143, as shown in step S150. The aforementioned cover ring 144 includes a horizontal extension portion 1441 and a vertical extension portion 1442. the horizontal extension portion 1441 is horizontal extension portion 144*a*, and the horizontal extension portion 1441 is disposed at a top edge of the second side wall 1432, and the horizontal extension portion 1441 partially shields the annular groove area from above. The vertical extension portion 1442 perpendicularly extends from the edge of the horizontal extension portion 1441, and the vertical extension portion 1442 is located between the first side wall 1431 and the second side wall 1432. The vertical extension portion 1442 extends toward the bottom 1433 without contacting the bottom 1433. The order of execution of step S150 is not limited to be after step S140, but may also be after step S110.

Through the above approaches, this disclosure is able to sufficiently remove the target material particles floating in the reaction chamber 110, avoid the target material particles floating or affect the quality of the film growth, and at the same time, reduce the deposition of the target material in the equipment, prolong the maintenance cycle of the equipment, and shorten the time needed for the maintenance of the equipment.

What is claimed is:

1. A particle prevention method of assembling a particle prevention device to remove particles in a reaction chamber, wherein a holder plate is disposed within an accommodating space of the reaction chamber; the method comprising:

providing a shielding ring, wherein the shielding ring includes a first side wall, a second side wall, and a bottom, the second side wall is parallel to the first side wall, and the bottom is connected to the first side wall and the second side wall to form an annular groove area; and the bottom is provided with at least one flow aperture, and an inner side of the second side wall defines an opening to receive the holder plate;

connecting the first side wall to the reaction chamber with the first side wall extending toward an upper portion of the accommodating space of the reaction chamber;

fixing a first deflector plate to the first side wall, wherein the first deflector plate extends obliquely toward the bottom, such that the first deflector plate is located above the at least one flow aperture of the bottom;

fixing a second deflector plate to the second side wall, wherein the second deflector plate is located above the first deflector plate, wherein the first deflector plate extends obliquely toward the bottom without contacting the bottom and the first side wall;

partially shielding the at least one flow aperture in a radial direction with the first deflector plate; and disposing a cover ring above the shielding ring, wherein the cover ring comprises:

a horizontal extension portion, disposed around a window, and the horizontal extension portion is disposed at a top edge of the second side wall; and a vertical extension portion, perpendicularly extending from the horizontal extension portion and located between the first side wall and the second side wall.

2. The particle prevention method according to claim 1, wherein the first side wall and the second side wall are circular walls.

3. The particle prevention method according to claim 1, wherein the vertical extension portion extends toward the bottom without contacting the bottom.

4. The particle prevention method according to claim 1 further comprising providing the horizontal extension portion to partially shield the annular groove area from above.

5. The particle prevention method according to claim 1, further comprising:

providing a first connection portion and a second connection portion;

fixing the first connection portion to the first side wall, wherein the first deflector plate extends from the first connection portion to be indirectly fixed to the first side wall; and fixing the second connection portion to the second side wall, wherein the second deflector plate extends from the second connection portion to be indirectly fixed to the second side wall.

6. The particle prevention method according to claim 1, further comprising partially shielding the first deflector plate from above with the second deflector plate.

7. A particle prevention device disposed in a reaction chamber comprising:

a holder plate disposed within an accommodating space of the reaction chamber;

a shielding ring, including a first side wall, a second side wall, and a bottom, wherein, the first side wall extends toward an upper portion of the accommodating space and is connected to the reaction chamber; the second side wall is parallel to the first side wall and extends toward the upper portion of the accommodating space, and an inner side of the second side wall defines an opening to receive the holder plate; and the bottom being is connected to the first side wall and the second side wall to form an annular groove area, and the bottom is provided with at least one flow aperture;

a first deflector plate, fixed to the first side wall and extends obliquely toward the bottom, wherein the first deflector plate is located above the at least one flow aperture of the bottom; and a second deflector plate, fixed to the second side wall, located above the first deflector plate, and extending obliquely toward the bottom;

wherein a cover ring is disposed above the shielding ring, the cover ring comprises:

a horizontal extension portion, disposed around a window, and the horizontal extension portion is disposed at a top edge of the second side wall; and a vertical extension portion, perpendicularly extending from the horizontal extension portion and located between the first side wall and the second side wall.

8. The particle prevention device according to claim 7, wherein the first side wall and the second side wall are circular walls.

9. The particle prevention device according to claim 7, wherein the vertical extension portion extends toward the bottom without contacting the bottom.

10. The particle prevention device according to claim 7, wherein the horizontal extension portion partially shields the annular groove area from above.

11. The particle prevention device according to claim 7, further comprising first connection portion and a second connection portion; wherein the first connection portion is fixed to the first side wall, and the first deflector plate extends from the first connection portion to be indirectly fixed to the first side wall; the second connection portion is fixed to the second side wall, the second deflector plate extends from the second connection portion to be indirectly fixed to the second side wall.

12. The particle prevention device according to claim 7, wherein the first deflector plate partially shields the at least one flow aperture in a radial direction.

13. The particle prevention device according to claim 7, wherein the second deflector plate partially shields the first deflector plate from above.

* * * * *